(12) United States Patent
Pavey

(10) Patent No.: US 6,694,497 B2
(45) Date of Patent: Feb. 17, 2004

(54) METHOD OF TESTING INTEGRATED CIRCUITRY AT SYSTEM AND MODULE LEVEL

(75) Inventor: Nicholas Pavey, Almondsbury (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 80 days.

(21) Appl. No.: 10/010,962

(22) Filed: Oct. 26, 2001

(65) Prior Publication Data

US 2003/0110456 A1 Jun. 12, 2003

(51) Int. Cl.[7] ............................................. G06F 17/50
(52) U.S. Cl. ................................................. 716/4; 716/3
(58) Field of Search .............................. 716/1–14, 4, 3

(56) References Cited

U.S. PATENT DOCUMENTS

| | | | | |
|---|---|---|---|---|
| 5,276,880 A | * | 1/1994 | Platoff et al. ............... | 717/143 |
| 5,437,037 A | * | 7/1995 | Furuichi ...................... | 717/146 |
| 5,913,023 A | * | 6/1999 | Szermer ....................... | 714/38 |
| 6,031,993 A | * | 2/2000 | Andrews et al. ............ | 717/143 |
| 6,505,342 B1 | * | 1/2003 | Hartmann et al. .......... | 717/104 |
| 2002/0002698 | * | 1/2002 | Hekmatpour .................. | 716/4 |

* cited by examiner

*Primary Examiner*—Matthew Smith
*Assistant Examiner*—Sun James Lin
(74) *Attorney, Agent, or Firm*—Lisa K. Jorgenson; James H. Morris; Wolf, Greenfield & Sacks, P.C.

(57) ABSTRACT

A method of testing integrated circuitry at a module and system level, in which an intermediate test, including multiple testing steps, is generated in a third programming language. The intermediate test is converted into an abstract representation of the testing steps. System and module level tests based on the abstract representation are generated in second and first respective programming languages. The integrated circuitry is then tested at system level with the system-level test and at module level with the module level test.

7 Claims, 3 Drawing Sheets

METHOD OF TESTING INTEGRATED CIRCUITRY AT SYSTEM AND MODULE LEVEL

FIELD OF INVENTION

The present invention relates to software verification of integrated circuit designs at the module and system level.

The system has been developed primarily for use in generating one or more module level tests from a system level test, or vice versa, by way of an intermediate command language, and will be described hereinafter with reference to this application. However, it will be appreciated that the invention is not limited to use in this field.

BACKGROUND TO INVENTION

In integrated circuitry design and simulation, different methodologies and tools are used at the system and module level. For example, system level verification is typically done by writing small programs in either assembly code or C to create the scenario that is sought to be tested. The test is implemented and the results compared with those generated by a reference simulator.

Module level verification, on the other hand, is usually done by writing a testbench in a hardware description language such as Verilog or VHDL. Expected results are calculated in advance and compared within the testbench without the use of a reference simulator.

Unfortunately, engineering effort is wasted since tests must be written twice—once for each level—and it is easy to introduce errors if tests are ported from one level to the other. In addition, skilled engineers are required to be fluent and in assembler and/or C and in module level testbench writing.

SUMMARY OF INVENTION

In accordance with the present invention, there is provided a method of testing integrated circuitry at a module and system level, the method including the steps of:

- generating an intermediate test in a third programming language (intermediate language), the intermediate test comprising a plurality of testing steps;
- converting the intermediate test into an abstract representation of the testing steps;
- generating a module level test based on the abstract representation, the module level test being in a second programming language;
- testing the integrated circuitry at the module level using the module level test;
- generating a system level test based on the abstract representation, the system level test being in a first programming language;
- testing the integrated circuitry at the system level using the system level test;
- wherein the system level test and the module level test are equivalent.

Preferably, prior to generating the intermediate test, of providing a parser, the parser being configured to implement a grammar for the intermediate language. More preferably, the step of converting the intermediate test into the abstract representation of the testing steps includes the sub-step of parsing the intermediate language through the parser, thereby generating the abstract representation.

In a preferred form, the abstract representation takes the form of an abstract syntax tree. More preferably, each node of the abstract syntax tree includes information used in the steps of generating the system and module level tests.

It is preferred that the intermediate test include one or more compilation directives indicative of parallelism in the system and module level tests, the parser being configured to provide the directives in the abstract representation.

In one preferred embodiment, hardware crunches are used in implementing the system level DUT, the compilation directives being interpreted to enable the system to be tested notwithstanding inherent parallelism.

BRIEF DESCRIPTION OF DRAWINGS

A preferred embodiment of the invention will now be described, by way of example only, with reference to the accompanying drawings, in which.

DETAILED DESCRIPTION OF PREFERRED AND OTHER EMBODIMENTS

Figure 2:
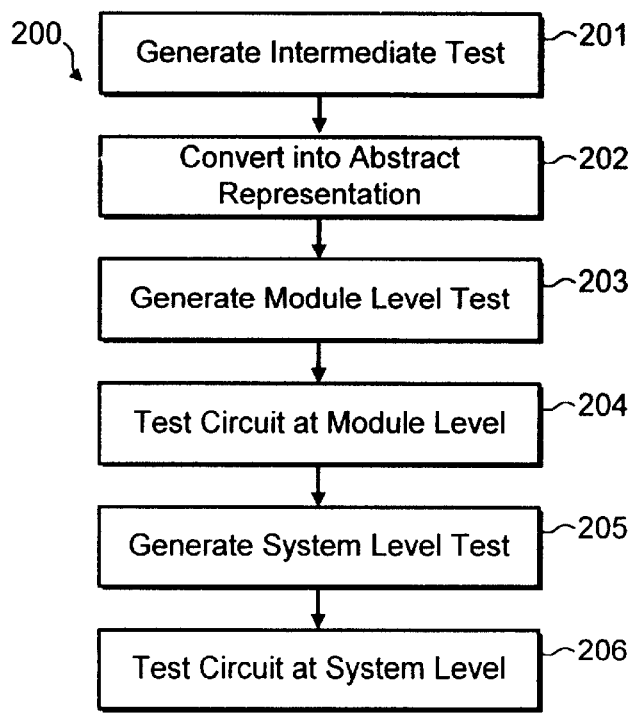
FIG. 2 is a flowchart showing the steps involved in generating tests for use in module and system level verification of a circuit design, the flowchart being in accordance with the invention.
Figure 3:
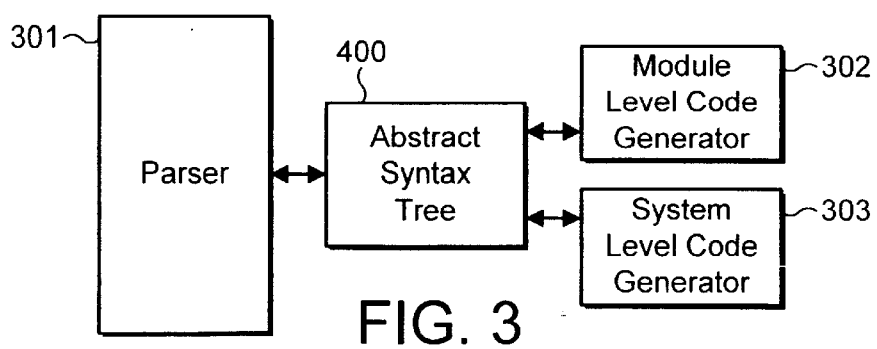
FIG. 3 is architecture for implementing a method of generating system and module level tests in respective first and second programming languages for the DUT shown in FIG. 1, in accordance with the invention.

The overall methodology of the preferred embodiment described herein is illustrated in the flowchart 200 of FIG. 2. Steps in the flowchart will be referred to throughout the detailed description as required.

Figure 1:
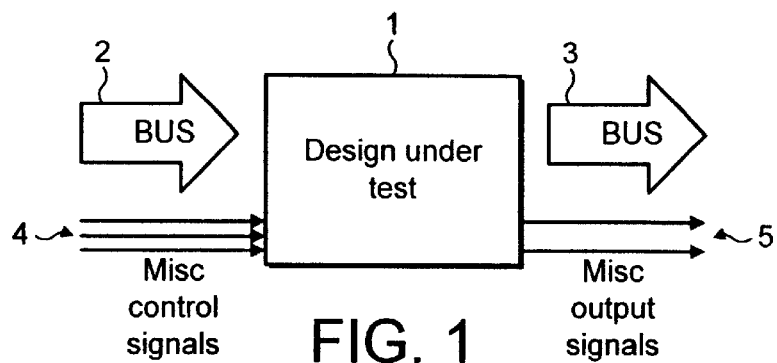
FIG. 1 is a schematic of a design under test (DUT), showing bus and control signal connections.

Turning to FIG. 1, the preferred embodiment is implemented in relation to an integrated circuit design under test (DUT) 1. The DUT 1 is controlled by a set of control registers (not shown), which are written to and read by sending data packets over buses 2 and 3. Other control signals 4 that affect the behaviour of the DUT 1 are supplied, and the DUT also outputs miscellaneous output signals 5. The control signals 4 can originate in other blocks or outside the chip.

A test scenario is developed by programming the device with a sequence of control register accesses, in combination with specific activity on the control wires 4. The relative timing of the programming from the bus 2 and the activity on the control wires 4 is important, as is well understood by those skilled in the art.

The DUT needs to be tested at the system and module levels. For the purposes of the present exemplary embodiment, the test desired to be implemented at the two levels can be expressed in the following terms:

Write a value to control registers 1 through 3.

Set a specific bit in control register 4 using a read/modify/write sequence and simultaneously ensure that input signal "interrupt_request" is high.

Wait for output signal "interrupt_grant" to go high.

Clear input signal "interrupt request".

It will be appreciated that this test is merely an example and that any other combination of steps can be implemented depending upon the specific testing requirements of the design being tested.

The steps required for achieving this are set out in the flowchart 200 of FIG. 2. To begin with, an intermediate test is generated 201 in a third programming language, which in the present cases is shown as a generic high-level test specification language. In the present example, the following intermediate test is the result:

```
WRITE (CR1, val1);
WRITE (CR2, val2);
WRITE (CR3, val3);
READ (CR4, tmp);
OR(0x1, tmp);
PARALLEL
{
    WRITE(CR4, tmp);
    SET SIGNAL("interrupt_enable") = 1'b1;
}
MODULE
{
    LOOP UNTIL SIGNAL("interrupt_grant") == 1'b1;
}
SET SIGNAL("interrupt_request") = 1'b0;
```

This code can be hand-written or generated by selecting from a library of predetermined instructions and routines.

Figure 4:
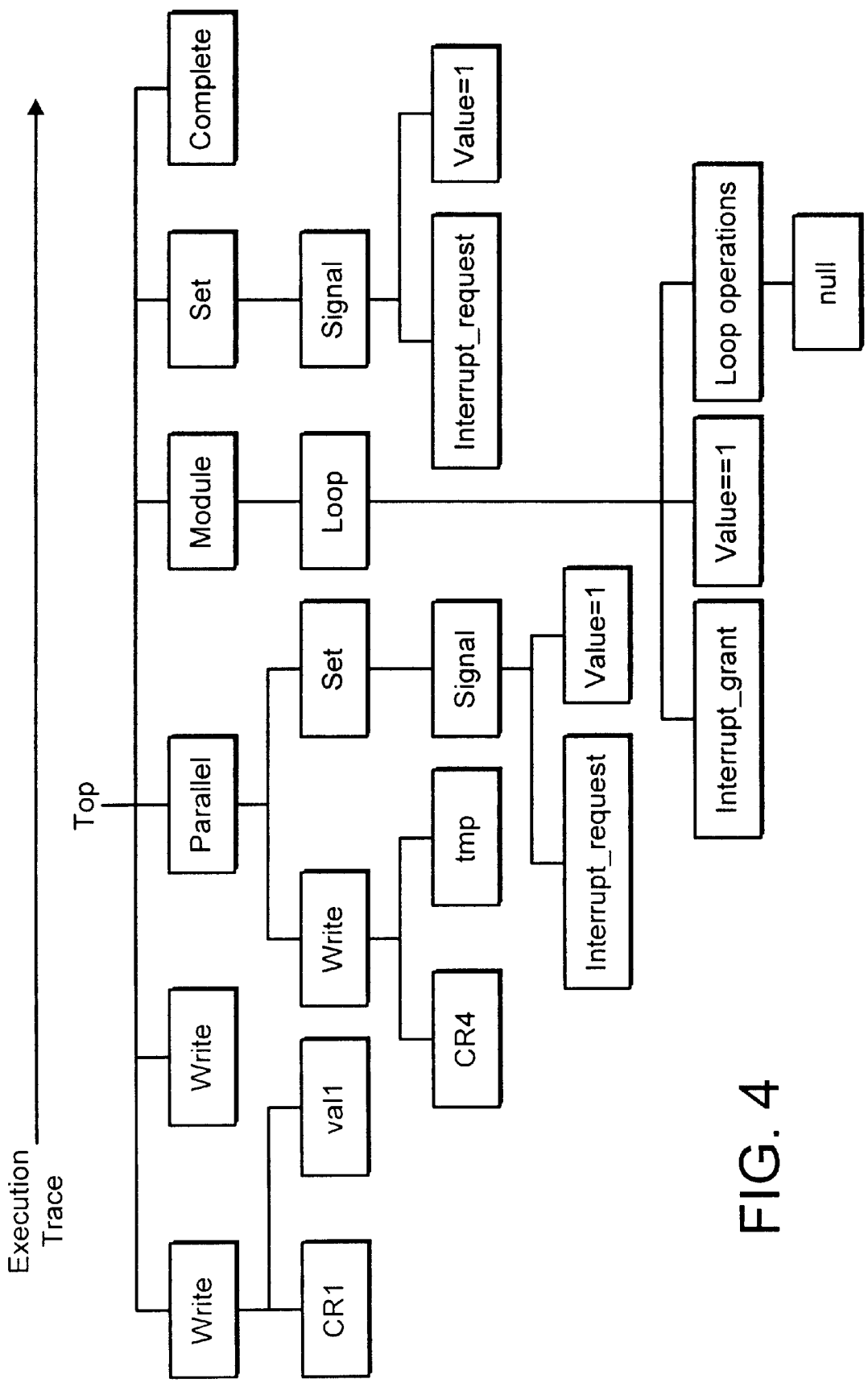
FIG. 4 is an abstract representation of an intermediate test written in a third language for use with the architecture of FIG. 3.
Figure 5:
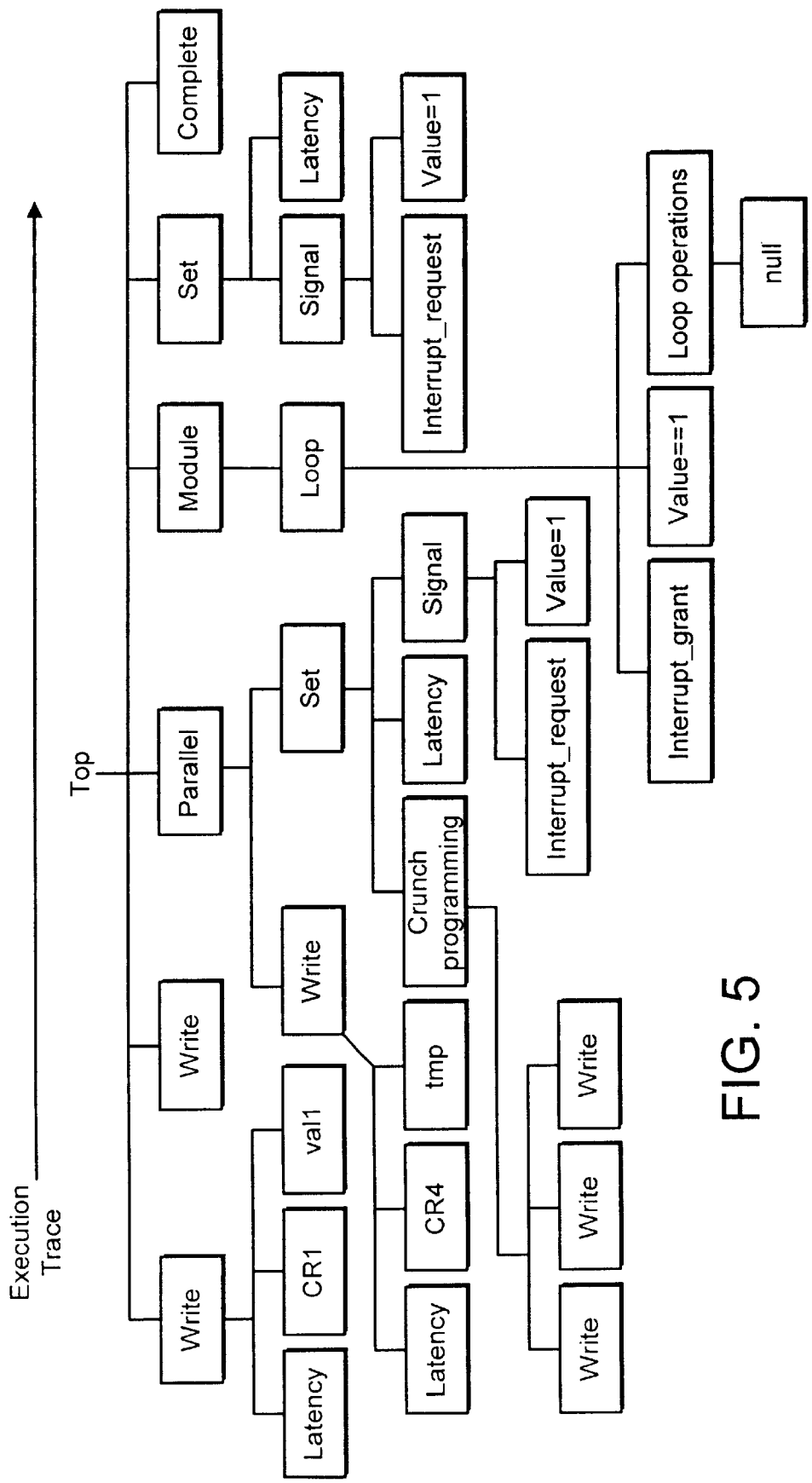
FIG. 5 is an abstract representation of the intermediate test shown in FIG. 3, including latency and crunch programming information.

The intermediate test is analysed by a parser 301, which generates (step 202) an abstract representation of the steps, in the form of an abstract syntax tree 400 as shown in FIGS. 4 and 5. To generate the abstract syntax tree 400, each program instruction from the intermediate test is mapped to a step forming part of the tree. Chronological execution of the abstract syntax tree 400 starts at the left side, and moves sequentially to the right. Each new junction indicates a new instruction branch to be implemented. FIG. 5 is similar to FIG. 4, but incorporates latency and crunch programming information. The need for, and use of, crunches is explained under the heading "Generation of System Level Tests".

A further obstacle to be overcome is that of latency. Very often test writers do not have (and ideally should not need to have) exact knowledge of precisely how much time elapses between a store to a control register and the effect of that store happening. However, a lack of knowledge of such factors can cause problems when trying to synchronise parallel behaviour.

The solution is to use a "window" technique to generate a test that repeats the same scenario multiple times until all possible latency combinations are covered. Writing tests like this by hand is laborious, so automation of the process in the preferred form can save substantial time and effort for test designers.

Generation of Module Level Tests

The abstract syntax tree 400 shown in FIGS. 4 and 5 is used to generate (step 203) a module level test in a first language, being a hardware design language (HDL) such as Verilog or VHDL. These design languages are well known within the hardware testing industry, and various companies provide design environments for either language.

The module level test is generated by a module level code generator 302, which takes as an input the abstract syntax tree 400 of FIG. 4. The module level test generated in the present case is:

```
module test( );
    initial
    begin
        WRITE(CR1, val11);
        #100 WRITE(CR2, val2);
        #100 WRITE(CR3, val3);
        #100 READ(CR4, tmp);
        #100 sync = 1'b1;
        #5 sync = 1'b0;
        while (interrupt_grant == 1'b0)
            interrupt_request = 1'b0;
    end
    always @ (posedge sync)
        WRITE(CR4, tmp | 1;b1);
    always @ (posedge sync)
        interrupt_request = 1'b1;
endmodule;
```

(For simplicity, the code generated for module testing is presented in Verilog pseudo-code, as opposed to a proprietary high-level testbench design language as would be generated in actual implementation.)

This code is then used for testing (step 204) at the module level of the DUT.

It will be noted that the code is generated by moving from left to right in the abstract syntax tree 400, mapping each new instruction found onto an equivalent instruction in the second language. This is done until all junctions and branches have been traversed.

It should be noted that parallelism is relatively easily handled in the module level environment. It is also relatively easy to deal with parallel operations with different latencies. For example, in a slightly modified embodiment, the following pseudo-code code is generated.

This embodiment of the module level test provides for different latencies in different registers:

```
module test( );
    initial
    begin
        WRITE(CR1, val11);
        #100 WRITE(CR2, val2);.#100 WRITE(CR3, val3);
        #100 READ(CR4, tmp);
        #100 master_sync = 1'b1;
        #5 master_sync = 1'b0;
        while (interrupt_grant == 1'b0)
            interrupt_request = 1'b0;
    end
    always @ (posedge master_sync)
    begin
        sync_10_cycle_operation = 1'b1;
        #10 sync_1_cycle_operation = 1'b1;
        #1 sync_10_cycle_operation = 1'b0;
        sync_1_cycle_operation = 1'b0;
    end
    always @ (posedge sync_10_cycle_operation)
        WRITE(CR4, tmp | 1;b1);
    always @ (posedge sync_1_cycle_operation)
        interrupt_request = 1'b1;
endmodule;
```

To generate this module level test from the abstract syntax tree 400 (and thereby from the intermediate test), the module level code generator must have some knowledge of the potential range of latencies in (in this case) the registers being written to and read from. This information can be provided to the module level test generator prior to generating the module level test from the abstract syntax tree, or can be added to the intermediate test explicitly.

In an alternative embodiment, the module level test is generated in a higher-level language that interfaces with the HDL simulator, thereby insulating the user from the inner workings of the testbench.

Generation of System Level Tests

The abstract syntax tree of FIGS. 4 and 5 is also used by the system level test generator to generate (step 205) a system level test in a second language, in this case in C. This test is then used to test the DUT at the system level (step 206).

As discussed above, there are some difficulties to be dealt with when generating testing code for system level test. In particular, as well as the latency issue described in relation to the module level test, there is often a need to deal with hardware "crunches". The need for crunches stems from the differing abilities of module and system level tests to deal with parallelism. A module level test will typically be able to control multiple ports of a DUT on a cycle-by-cycle basis.

In contrast, system level tests are typically run on a processor embedded in the system which is only able to execute one instruction at a time (although there are exceptions to this) and only has one bus. In addition, very often the control signals from the DUT are not provided by the processor, but by some other combination of hardware components.

Crunches can be programmed to control external signals at given times. The crunch is programmed in advance by the processor using control registers, and the timing is carefully selected so that the correct signal activity coincides with the bus activity.

Therefore, when translating from the intermediate test to the system level test, the system level code generator must usually have some knowledge of the crunch hardware and the signals it controls. More particularly, the system level code generator will usually be able to output crunch programming commands and schedule the signal activity correctly.

To enable the code to do this, crunch programming definitions are included in the language, as follows:

```
CRUNCH ("interrupt_request")
{
    VALUE_CTRL_REG: <control register address> [BITS : range]
    DELAY_CTRL_REG: <control register address> [BITS:range]
    ENABLE_CTRL_REG: <control register address> [BITS:range]
}
```

This allows the code generator to work out automatically which control registers to use to control a given signal, and the timing of such use. The code generator simply generates writes to the addresses specified in the order the registers are defined.

Often crunch hardware makes use of a single bit within a register (typically 32 bits) to control a signal. In the case where a bit range is specified, this will result in a read/modify/write operation to prevent corruption of the other bit fields.

Notice that in addition to the crunch hardware, it is desirable to provide some signal monitoring hardware so the C program can read back signal values. This is a simple way of dealing with complex code generation problems like interrupt handlers by using polling instead.

```
void test( )
{
    //initialise crunch hardware
    WRITE(CRUNCH_INT_REQ_VAL, 1);
    WRITE(CRUNCH_DELAY, latency);
    //do the writes to the DUT control register
    WRITE(CR1, val1);
    WRITE(CR2, val2);
    WRITE(CR3, val3);
    READ(CR4, tmp);
    //initialise the crunch hardware
    WRITE(CRUNCH_ENABLE, 1);.WRITE(CR4, tmp | 0x1);
    //loop until termination condition detected
    while (READ(SIGNAL_MONITOR_INT_GNT) != 1'b1);
    //reprogram the crunch to bring interrupt enable low
    WRITE(CRUNCH_ENABLE, 0);
    WRITE(CRUNCH_INT_REQ_VAL, 0);
    WRITE(CRUNCH_DELAY, 0);
    WRITE(CRUNCH_ENABLE, 1);
    exit(0);
}
```

Adding latency handling code would result in the following C pseudo code:

```
void test( )
{
    for latency = 0 to (sum of latencies in parallel block)
    {
        //initialise crunch hardware
        WRITE(CRUNCH_INT_REQ_VAL, 1);
        WRITE(CRUNCH_DELAY, latency);
        //do the writes to the DUT control register
        WRITE(CR1, val1);
        WRITE(CR2, val2);
        WRITE(CR3, val3);
        READ(CR4, tmp);
        WRITE(CRUNCH_ENABLE, 1);
        //insert some delay to ensure that latency window
        //covers the operation completely (before -> after)
        for delay = 0 to max latency
        WRITE(CR4, tmp | 0x1);
        //loop until termination condition detected
        while (READ(SIGNAL_MONITOR_INT_GNT) != 1'b1);
        //reprogram the crunch to bring interrupt enable low
        WRITE(CRUNCH_ENABLE, 0);
        WRITE(CRUNCH_INT_REQ_VAL, 0);
        WRITE(CRUNCH_DELAY, 0);
        WRITE(CRUNCH_ENABLE, 1);
        //wait for the crunch hardware to do operation
        for delay = 0 to 5 { }
        //ensure that crunch is disabled
        WRITE(CRUNCH_ENABLE, 0);.}
}
```

By enriching the test specification language, it is possible to automatically generate interrupt-handling code. In this case it is necessary to declare to the generator that a given code fragment is going to be called in response to a certain event happening, for example as follows:

```
WRITE (CR1, val1);
WRITE (CR2, val2);
WRITE (CR3, val3);
READ (CR4, tmp);
OR(0x1, tmp);
PARALLEL
{
    WRITE(CR4, tmp);
    SET SIGNAL("interrupt_enable") = 1'b1;
```

-continued

```
}
MODULE
{
    LOOP UNTIL SIGNAL("interrupt_grant") == 1'b1;
}
SYSTEM
{
    ASYNC ON (SIGNAL("interrupt_grant")==1) USING
interrupt_handler
    {
        SET SIGNAL("interrupt_request") = 1'b0;
    }
}
FRAGMENT interrupt_handler
void interrupt handler( )
{
    INSERT
}
ENDFRAGMENT
```

This pseudo code allows the code generator to work out that the interrupt handler is not part of the normal thread of execution, and instead should be launched asynchronously. Since the code generator does not know anything about the architecture of the processor it is running on, a certain amount of the code structure needs to be given to it.

The fragment statement specifies that when the code generator comes to synthesise the code to deal with the "interrupt_grant" signal, it should insert the contents of the fragment. The "INSERT" statement tells the generator wherein the fragment to put the synthesized code. This is to allow the user to do some pre-initialisation and clean up.

The MODULE and SYSTEM directives allow the user to specify which parts of the code should be synthesised to which platform. This makes the job of the code generator easier because it does not need to have such a fine understanding of which structures are suitable for module level and system level respectively.

It will be appreciated that the present invention has been described in relation to a simple test of a particular DUT scenario. However, even greater efficiency can be obtained when the invention is applied to more complicated or time-consuming test tasks. It will also be appreciated that other designs can be tested using similar methodology to that described above in relation to the preferred embodiment.

Although the invention has been described in relation to a specific preferred embodiment, it will be appreciated that the invention be embodied in many other forms.

What is claimed is:

1. A method of testing integrated circuitry at a module and system level, the method including the steps of:

generating an intermediate test in a third programming language, the intermediate test comprising a plurality of testing steps;

converting the intermediate test into an abstract representation of the testing steps;

generating a module level test based on the abstract representation, the module level test being in a second programming language;

testing the integrated circuitry at the module level using the module level test;

generating a system level test based on the abstract representation, the system level test being in a first programming language;

testing the integrated circuitry at the system level using the system level test;

wherein the system level test and the module level test are equivalent since they are both generated from a common abstract representation.

2. A method according to claim 1, further including a step, prior to generating the intermediate test, of providing a parser, the parser being configured to implement a grammar for the third programming language.

3. A method according to claim 2, wherein the step of converting the intermediate test into the abstract representation of the testing steps includes the sub-step of parsing the third programming language through the parser, thereby generating the abstract representation.

4. A method according to claim 3, wherein the abstract representation takes the form of an abstract syntax tree.

5. A method according to claim 4, wherein each node of the abstract syntax tree includes information used in the steps of generating the system and module level tests.

6. A method according to claim 2, wherein the intermediate test includes one or more compilation directives indicative of parallelism in the system and module level tests, the parser being configured to provide the directives in the abstract representation.

7. A method according to claim 6, wherein hardware crunches are used in implementing the system level test, the compilation directives being interpreted to enable the system to be tested notwithstanding inherent parallelism.

* * * * *

UNITED STATES PATENT AND TRADEMARK OFFICE
CERTIFICATE OF CORRECTION

PATENT NO. : 6,694,497 B2
DATED : February 17, 2004
INVENTOR(S) : Nicolas Pavey

It is certified that error appears in the above-identified patent and that said Letters Patent is hereby corrected as shown below:

<u>Column 3,</u>
Lines 11, 12 and 13, should read as shown below:
-- WRITE (CR1, val1);
   WRITE (CR2, val2);
   WRITE (CR3, val3); --

Signed and Sealed this

Thirteenth Day of April, 2004

JON W. DUDAS
*Acting Director of the United States Patent and Trademark Office*